United States Patent [19]

Tsuaki et al.

[11] Patent Number: 4,843,592
[45] Date of Patent: Jun. 27, 1989

[54] MICROCOMPUTER CONTROLLED APPARATUS PROVIDED WITH A BATTERY VOLTAGE DETECTION CIRCUIT

[75] Inventors: Hajime Tsuaki, Gifu; Tomio Sugimura, Aichi, both of Japan

[73] Assignee: Kabushiki Kaisha Toshiba, Kawasaki, Japan

[21] Appl. No.: 36,222

[22] Filed: Apr. 9, 1987

[30] Foreign Application Priority Data

Apr. 10, 1986 [JP] Japan .................................. 61-82984

[51] Int. Cl.[4] ............................................. G06F 11/00
[52] U.S. Cl. ...................................... 364/900; 371/12
[58] Field of Search ... 364/200 MS File, 900 MS File, 364/184, 185; 371/12; 365/226

[56] References Cited

U.S. PATENT DOCUMENTS 4,234,920  11/1980  Van Ness et al. .................. 364/200
4,458,307   7/1984  McAnlis et al. .................... 364/200

Primary Examiner—Thomas M. Heckler
Attorney, Agent, or Firm—Cushman, Darby & Cushman

[57] ABSTRACT

In a microcomputer controlled apparatus there is provided a device for memorizing that the battery voltage has dropped below a predetermined value and a control device for stopping the execution of the program. Subsequently if the battery voltage rises and execution of the program is restarted, the control device determines from the memorizing device that a voltage drop occurred and forcedly stops the execution of the program until the old discharged battery is replaced with a new fully charged battery.

10 Claims, 4 Drawing Sheets

MICROCOMPUTER CONTROLLED APPARATUS PROVIDED WITH A BATTERY VOLTAGE DETECTION CIRCUIT

BACKGROUND OF THE INVENTION

The invention relates to a microcomputer controlled apparatus which employs batteries as power supplies for word processors and personal computers, and which includes a battery voltage detection circuit for detecting a drop in the power supply voltage.

Recently, microcomputer controlled apparatuses of the hand held type such as word processors and personal computers have appeared on the market. Many of these microcomputer controlled apparatuses use batteries as their power supply. In conventional microcomputer controlled apparatuses, which use batteries, there are provided battery voltage detection circuits and indicators which inform operators about the consumption of the batteries. Further, in a conventional battery voltage detection circuit, the battery voltage is detected, and if the battery voltage drops below a specific reference value, microprocessors controlling peripheral equipments, such as printers and floppy disc drives, are stopped and indicators are turned on. The operators see the indicators, confirm the consumption of the batteries, and then turn off power supply switches and exchange the batteries with new ones.

In conventional microprocessor controlled apparatuses provided with battery voltage detection circuits, however, when the battery voltage drops below a fixed reference value, the microprocessor may be stopped. In that case, after the peripheral equipments stop operating, if the switches are left on for a while the load current of the battery may decrease owing to the stop operation of the peripheral equipments and the voltage may rise. The battery voltage detection circuits erroneously detect this as a normal voltage and reset the microprocessor. Then the microprocessor begins to execute operations again. As a result, the peripheral equipments begin to operate again, which causes an increase in power consumption and a drop in the battery voltage. The microprocessor may then be stopped again. If this is caused repeatedly, the battery voltage will drop so excessively as to be below the fixed reference value which guarantees the operation of the microprocessor. This may cause further trouble resulting in misoperation of the microcomputer causing erroneous program execution.

Therefore, to prevent this trouble, besides the battery voltage detection circuit for detecting whether the battery voltage is higher or not than the first reference voltage necessary for the normal operation of the microprocessor, the conventional apparatus has a second battery voltage detection circuit, provided with a second reference voltage being higher than the first reference voltage, for detecting whether a battery voltage is higher or not than the second reference voltage. The second battery voltage detection circuit informs the operator about consumption of the battery in the case where the battery voltage drops below the second reference voltage.

At that time, since the battery voltage doesn't drop below the first reference voltage, it doesn't stop the operation of the peripheral equipments and allows the operators to use the apparatus. In such cases, the batteries can be exchanged early enough that the microprocessors can be prevented from misoperating. But just after the battery voltage becomes below the second reference value, if the battery is exchanged with a new one, it may be uneconomical to throw away the old battery.

SUMMARY OF THE INVENTION

An object of the invention is to provide a microcomputer controlled apparatus having a battery voltage detection circuit to prevent erroneous program execution, because of excessive drop in the battery voltage which is caused by repeated start and stop operations of the peripheral equipment owing to drops in the battery voltage.

A microcomputer controlled apparatus according to the present invention is provided with a voltage drop detecting circuit, in which it is detected whether or not the output voltage of a battery is lower than the specified value previously set. When it is detected that the output voltage drop is lower than the specified value, a voltage drop detecting signal is output. When it is subsequently detected to be higher than the specified value, a reference voltage detecting signal is output.

A detection memory circuit is provided for memorizing the voltage drop detecting signal output by the voltage drop detecting circuit. Also provided are an alarm for informing the operator of the voltage drop and a system control circuit, in which when the output signal by the voltage drop detecting circuit is a voltage drop detecting signal, execution of a program is stopped, then after a while when the output voltage rises because of the stop and the output signal obtained from the voltage drop detecting circuit becomes the reference voltage detecting signal, execution of the program is started again. When it is shown that the voltage drop occurred, as a result of investigating the information memorized in the detection result memory circuit, execution of the program is stopped and the alarm is driven.

In other words, when the battery voltage becomes lower than the specified reference value, the system control circuit stops execution of the program. After that, when the voltage somewhat rises by the operation stop of the peripheries and becomes more than the reference value, the system control circuit starts execution of the program, but it investigates the information memorized by the detection result memory circuit and when the information shows occurrence of the voltage drop, the system control circuit stops execution of the system program and drives the alarm. Therefore, the stop operation of the peripheral equipment is not repeated, and battery voltage is not dropped excessively so that erroneous operation in executing the system program can be prevented. Further, according to the present invention described above, there is no need to set a second higher reference voltage, as in the prior art, and thus a battery can be used up to its capacity limit.

In order to achieve the above objects of the present invention, there is provided a microcomputer controlled apparatus employing battery voltage as a main power supply, comprising:

voltage drop detecting means for detecting whether or not the output voltage of a battery is lower than a previously set specified voltage;

detection result memory means for memorizing occurrence of the voltage drop when said voltage drop detecting means detects that the output voltage is lower than the specified voltage; and system control means, in which execution of a program is stopped when said voltage drop detecting means detects that the output voltage is lower than the specified voltage, execution of the program being restarted when the output voltage subsequently rises and said voltage drop detecting means detects that the output voltage is higher than the specified value, and which forcedly stops the execution of the program when it is determined that a voltage drop occurred from investigating the information memorized in said detection result memory means after execution of the program has been restarted.

BRIEF DESCRIPTION OF THE DRAWINGS

Other objects and features of the present invention will be apparent from the following description taken in connection with the accompanying drawings in which.

DETAILED DESCRIPTION OF THE PREFERRED EMBODIMENTS

Figure 1:
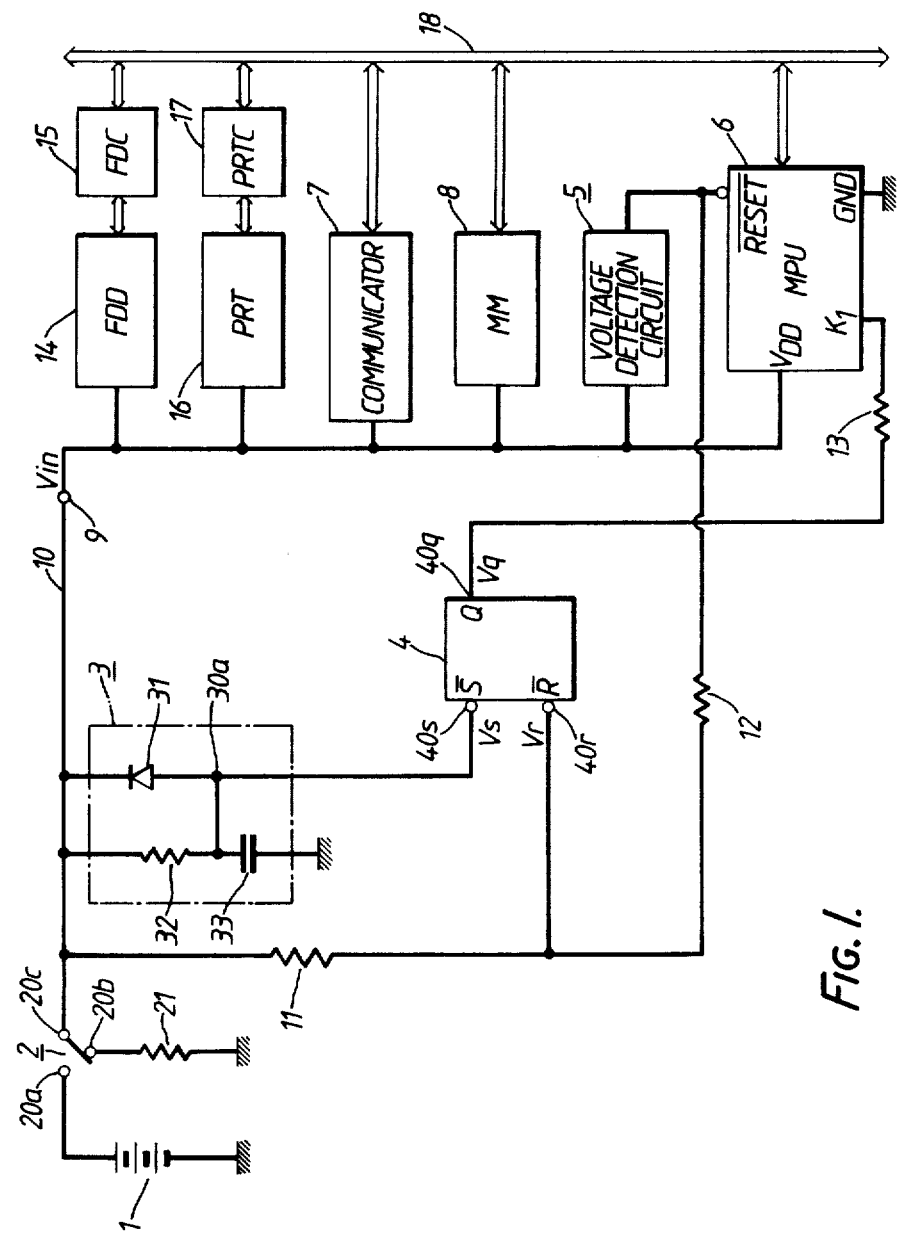
FIG. 1 is a block diagram schematically illustrating a preferred embodiment of this invention.

A preferred embodiment of this invention will now be explained with reference to the drawings. As illustrated in FIG. 1, a plus terminal of battery 1 used as a power supply is connected with a power supply line 10 through a fixed contact 20a and a movable contact 20c in a power switch 2. A fixed contact 20b in the power switch 2 is connected to ground through a resistance 21. The power supply line 10 is connected to a power supply terminal 9 of a voltage detection circuit 5, microprocessor unit (referred to as MPU hereinafter) 6, a communicator 7, a main memory apparatus (referred to as MM hereinafter) 8, a floppy disc drive (referred to as FDD hereinafter) 14 and a printer (referred to as PRT hereinafter) 16. An alarm or an indicator may be used as the communicator 7 which informs the operator about consumption of battery 1. MPU 6 is connected with MM 8, communicator 7, floppy disc drive controller (referred to as FDC hereinafter) 15 and printer controller (referred to as PRTC hereinafter) 17 through system bus 18. A reset circuit 3 includes a resistance 32, a condenser 33, a diode 31, having the polarity shown in FIG. 1 and which is connected between the common connection point of the resistance 32 and the condenser 33, and power supply line 10. The output terminal of the voltage detection circuit 5 is connected to a reset terminal (RESET) of MPU 6. The voltage detection circuit 5 detects whether a voltage Vin of power supply terminal 9 is over the prescribed reference value or not and gives a reset signal to a reset terminal of the MPU 6. The reset signal will be at a high level if the voltage Vin is over the prescribed reference value, and will be at a low level if the voltage Vin is below the prescribed reference value. When the battery 1 is switched on by closing the contacts (20c-20a) of the power switch 2, the voltage detection circuit 5 keeps the reset signal at low level during the prescribed time (beginning reset time of MPU 6). Then, the reset signal will rise from a low level to a high level. MPU 6 starts to operate at the start up signal. Further, the initial program memorized in MM 8 is read and executed.

Figure 2:
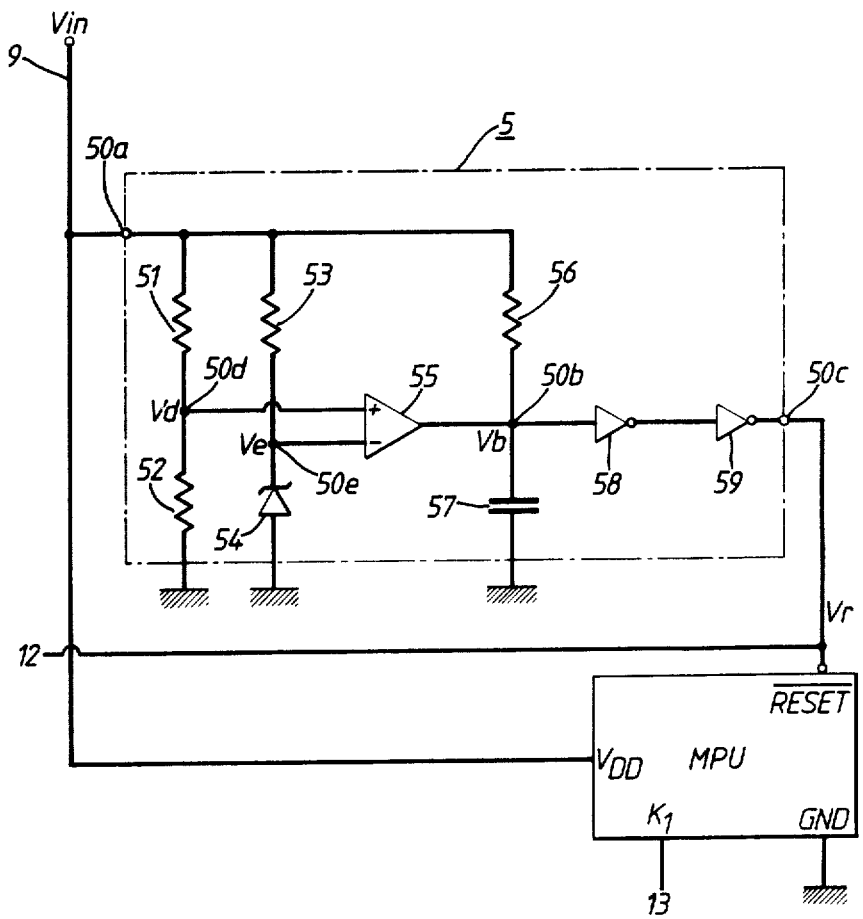
FIG. 2 is a block diagram illustrating in detail the voltage detection circuit shown in FIG. 1.

FIG. 2 illustrates in detail the structure of the voltage detection circuit 5. An input terminal 50a of the voltage detection circuit 5 is connected with power supply terminal 9. The input terminal 50a is connected with resistances 51, 53, and 56. The resistances 51 and 52 are connected in series between the input terminal 50a and ground. The resistance 53 and a constant-voltage diode 54, having the polarity shown in FIG. 2, are connected in series between the input terminal 50a and ground. The resistance 56 and a condenser 57 are connected in series between the input terminal 50a and ground. A plus input terminal of comparison unit 55 is connected with a common connection point 50d of the resistances 51 and 52, and a minus input terminal of comparison unit 55 is connected with a common connection point 50e of the resistance 53 and constant-voltage diode 54. The output terminal of the comparison unit 55 is connected with a common connection point 50b of the resistance 56 and the condenser 57. The comparison unit 55 compares the voltage Vd of the common connection point 50d of the resistances 51 and 52 with the reference voltage Ve of the common connection point 50d of the resistance 53 and the constant-voltage diode 54, and, if the voltage Vd is higher than the reference voltage Ve, the output signal goes to a high level, and, if the voltage Vd is lower than the reference voltage Vd, the output signal goes to a low level from the high level. Inverters 58 and 59 are connected in series between the common connection point 50b, of the resistance 56 and the condenser 57, and the output terminal 50c, of the voltage detection circuit 5. The output terminal 50c is connected with the reset terminal of the MPU 6 and the resistance 12, shown in FIG. 1.

Further, as illustrated in FIG. 1, the resistance 12 is connected with the reset input terminal 40r in the detection result memory circuit (referred to as memory circuit hereinafter) 4. This input terminal 40r is connected with the power supply line 10 through a pull-up resistance 11. The memory circuit 4 is a low-active type S-R flip-flop circuit consisting of two NAND circuits. The set input terminal 40s in the memory circuit 4 is connected with the output terminal 30a in the reset circuit 3. Further, the output terminal 40q in the memory circuit 4 is connected through resistance 13 with the input terminal K1 in MPU 6.

When the output terminal 40q is at low level and a signal given to the input terminal 40s changes from a high level to low level, the output terminal 40q goes to a high level, and the memory circuit 4 continues to memorize the condition. Until a signal given to the input terminal 40r changes from high level to low level, the output terminal 40q remains at the high level. Further, when the output terminal 40q is at high level and a signal given to the input terminal 40r changes from high level to low level, the output terminal 40q goes to a low level, and the memory circuit 4 continues to memorize the condition. Until a signal given to the input terminal 40s changes from high level to low level, the output terminal 40q remains at the low level. The output terminal 40q shows the reference voltage detection result when it's at the high level and shows the voltage drop detection result when it's at the low level. Further, the detection result memory circuit 4 feeds the content of the signal memorized from the output terminal 40q back to the input terminal K1. According to the condition of the signal level at the input terminal K1, a reset flag (not shown in the drawing) of the MPU 6 is set at "1" or "0". MPU 6 judges whether it stops the execution of the program or not, according to the condition of the reset flag.

Figure 3:
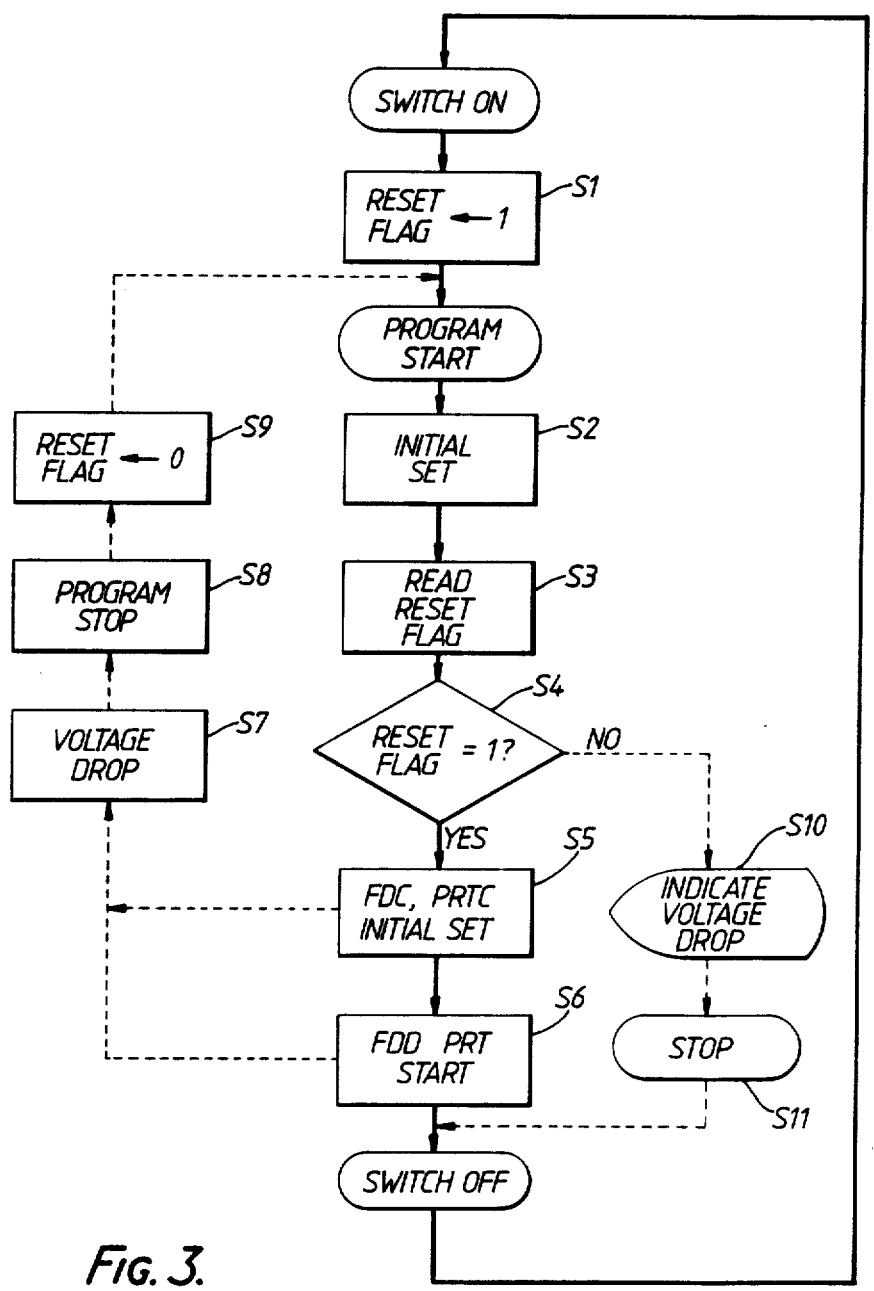
FIG. 3 is a flow chart illustrating the operation of the invention.
Figure 4:
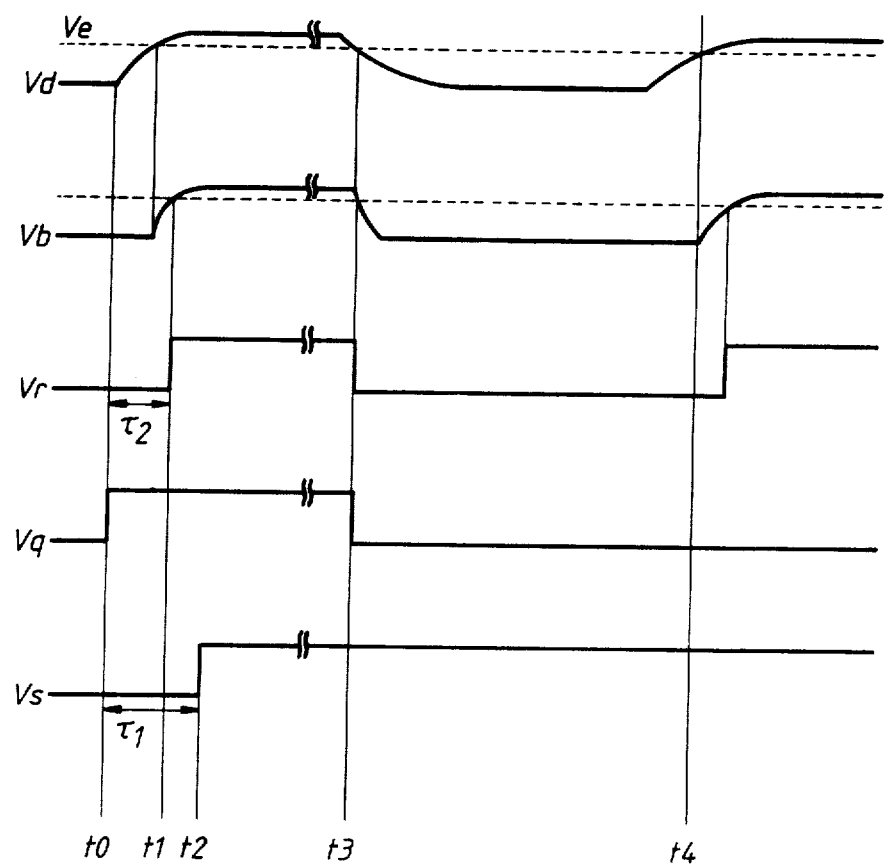
FIG. 4 is a timing chart illustrating relations between each signal input to or output from a detection result memory circuit shown in FIG. 1 and also illustrating relations between each signal in the voltage detection circuit shown in FIG. 2.

A detailed explanation of the operation of the above-described structure, will now be given with reference to the flow chart in FIG. 3 and the timing chart in FIG. 4.

The voltage of the battery 1 is assumed to be higher than the prescribed reference value. Then, if the power supply of the battery 1 is switched-on by closing of the contacts (20c-20a) of the power switch 2 at time t0, at first, the power supply Vin is given to the power detection circuit 5, MPU 6, the communicator 7, MM 8, FDD 14 and PRT 16. At this switched-on time t0, the output terminal 30a of the reset circuit 3 is still at low level and also the output terminal 50c of the voltage detection circuit 5 remains at the low level, because of the delay in operation of the voltage detection circuit 5. Therefore, as shown in FIG. 4, the voltage Vs of the set input terminal 40s and the voltage Vr of the reset input terminal 40r, in the memory circuit 4, are at the low level. According to the condition of these input terminals, the voltage Vq of the output terminal 40q remains at the high level. And, on the basis of the fact that the voltage Vq of the output terminal 40q in the memory circuit 4 is at the high level, the input terminal K1 of MPU 6 is given a high level signal. As a result, the reset flag of MPU 6 is set at "1" (step S1). Afterwards, as shown in FIG. 4, if the voltage Vd of the common connection point 50d in the voltage detection circuit 5 rises and becomes higher than the voltage Ve of the common connection point 50e, the output signal of the comparison unit 55 is inverted from a low level to a high level. The voltage Vd of the common connection point 50b gradually rises, and when it comes to time t1 passing through time τ2 from the power switched-on time t0 and reaches the input level of the inverter 58, the output signals of the inverters 58 and 59 are inverted and the output terminal 50c of the voltage detection circuit 5 changes from a low level to a high level. Consequently, the reset terminal (RESET) of MPU 6 goes from a low level to a high level and MPU 6 is started. The trigger signal given a start to the output terminal 50c is given to the input terminal 40r in the memory circuit 4 as shown in FIG. 4, but as this memory circuit 4 is a low-active type, the level condition of the output terminal 40q doesn't show any change.

Thereafter, when it comes to time t2 passing through time τ1 from the power switched-on time t0 on the basis of a time constant of the reset circuit 3, the output terminal 30a changes to a high level. Therefore, as shown in FIG. 4, the trigger signal at its start is given to the input terminal 40s of the memory circuit 4, and the level condition of the output terminal 40q of the memory circuit 4 doesn't show any change. The resistance values and the capacitances of the condensers in the reset circuit 3 and voltage detection circuit 5 are set up at such values that the time τ1 is longer than the time τ2.

On the other hand, when MPU 6 is started, MPU 6 reads the system program out of MM8 and starts to execute the system program. With the start of execution of the system program, at first, MPU 6 makes an initial setting of the system as shown in FIG. 3 (step S2). Then, MPU 6 reads the reset flag in (step S3). Next, MPU 6 judges whether the reset flag is set at "1" or not (step S4). At this stage, since the reset flag is set at "1", MPU 6 executes next step S5. MPU 6 makes an initial setting of FDC 15 and PRTC 17 at step S5, and FDD 14 and PRT 16 are started by FDC 15 and PRTC 17 at step S6.

Then, after a while, because of a drop in the voltage of the battery 1, resulting from the long use of the apparatus, the voltage Vd at the common connection point 50d in the voltage detection circuit 5 decreases, and at he time t3, becomes lower than the voltage Ve of the common connection point 50e. Accordingly, as shown in FIG. 4, the output signal of the comparison unit 55 is inverted from a high level to a low level. Then, the output signal of the inverters 58 and 59 are inverted, and, the output terminal 50c of the voltage detection circuit 5 changes from a high level to a low level (step S7). Now, the reset terminal (RESET) of MPU 6 changes from a high level to a low level and then the operation of MPU 6 stops (step S8). According to the operation stop of MPU 6, the operation of FDC 15 and PRTC 17 stop. The drop in the trigger signal of the output terminal 50c as shown in FIG. 1, is given to the reset input terminal 40r of the memory circuit 4. Thus, as shown in FIG. 4, the output terminal 40q of the memory circuit 4 changes to a low level. The memory circuit 4 will keep this condition even if the power of the battery recovers. The memory circuit 4 feeds the content of the memory back to the input terminal K1 of MPU 6 as a low level signal. As a result, the reset flag of MPU 6 is set at "0" (step S9).

Then, after a while, owing to the operation stop of FDC 15 and PRTC 17, the load current of the battery 1 will drop and voltage Vin rises. So, the voltage Vd of the common connection point 50d in the voltage detection circuit 5 rises. When the voltage Vd becomes higher than the voltage Ve of the common connection point 50e at the time t4, as shown in FIG. 4, the output signal of the comparison unit 55 changes from a low level to a high level. The voltage Vb of the common connection point 50b then gradually rises and reaches the input level of the inverter 58, the output signals of the inverters 58 and 59 are inverted and the output terminal 50c changes from a low level to a high level. Thus, the reset terminal (RESET) changes from a low level to a high level, and MPU 6 is started. The trigger signal giving a start to the output terminal 50c is given to the reset input terminal 40r of the memory circuit 4 as shown in FIG. 1, but the output terminal 40q doesn't show any change. Accordingly, MPU 6 begins to execute the system program again. At the start of the execution, at first, MPU 6 makes an initial setting of the system as shown in FIG. 3 (step S2). And MPU 6 reads the reset flag in (step S3). Next, MPU 6 judges whether the reset flag is set at "1" or not (step S4). At this stage, as the reset flag is set at "0", MPU 6 executes next step S10. MPU 6 will indicate a drop of the voltage to the operator by operating the communicator 7. Then, according to the step S11, MPU 6 stops the execution of the system program. After that, though the voltage Vin rises, said operation is repeated.

It should be appreciated that the above described description of the preferred embodiment does not limit the scope of the present invention in any way, and that various changes and modifications may be made without departing from the spirit and scope of the present invention.

What is claimed is:

1. A microcomputer controlled apparatus employing battery voltage as a main power supply, said apparatus comprising:

voltage monitoring means for monitoring output voltage of the main power supply and comparing the output voltage with a previously set specified voltage, said voltage monitoring means generating a first signal when the output voltage is lower than the previously set specified voltage and generating a second signal when the output voltage is not lower than the previously set specified voltage;

detection result memory means for memorizing information representing occurrence of a voltage drip when the first signal is received form said voltage monitoring means; and system control means for controlling execution of a program, said system control means stopping execution of the program when the first signal is received from said voltage monitoring means, said system control means restarting execution of the program, after said system control means has stopped execution of the program, when the second signal is received from said voltage monitoring means;

said system control means investigating whether or not the information representing occurrence of the voltage drop has been memorized in said detection result memory means after said system control means has restarted execution of the program;

said system control means further stopping execution of the program after determining that the information representing occurrence of the voltage drop has been memorized in said detection result memory means.

2. An apparatus as claimed in claim 1, said voltage monitoring means comprising a comparator circuit for comparing the previously set specified voltage with the output voltage of the main power supply and a circuit for outputting the signal representing the comparison result of the comparator circuit to said detection result memory means and said system control means.

3. An apparatus as claimed in claim 2, in which said detection result memory means comprises an S-R type flip flop.

4. An apparatus as claimed in claim 1, in which said detection result memory means comprises an S-R type flip flop.

5. An apparatus as claimed in claim 1, said system control means including a flag, set or reset on the basis of the information memorized by the detection result memory means and means which determines the status of the flag, wherein the determining means determines the flag after execution of the program has been started and stops the execution of the program when the flag indicates the occurrence of the voltage drop.

6. A microcomputer controlled apparatus employing battery voltage as a main power supply, said apparatus comprising:

voltage monitoring means for monitoring output voltage of the main power supply and comparing the output voltage with a previously set specified voltage, said voltage monitoring means generating a first signal representing whether or not the output voltage is lower than the previously set specified voltage;

detection result memory for memorizing information representing occurrence of voltage drop in accordance with reception of the first signal, generated by said voltage monitoring means, representing the output voltage being lower than the previously set specified voltage;

system control means for controlling execution of a program, said system control means stopping execution of the program in accordance with reception of the first signal, generated by said voltage monitoring means, representing the output voltage being lower than the previously set specified voltage;

said system control means restarting execution of the program, after it has stopped execution of the program, in accordance with reception of the first signal, generated by said voltage monitoring means, representing the output voltage not being lower than the previously set specified voltage;

said system control means investigating whether or not the information representing occurrence of the voltage drop has been memorized in said detection result memory means after said system control means has restarted execution of the program;

said system control means further stopping execution of the program after determining that the information representing occurrence of the voltage drop has been memorized in said detection result memory means, and generating a second signal representing occurrence of the excessive voltage drop; and information means for informing the occurrence of the excessive voltage drop in accordance with reception of the second signal generated by said system control means.

7. An apparatus as claimed in claim 6, said information means comprising an alarm device.

8. An apparatus as claimed in claim 6, said information means comprising an indicator device.

9. An apparatus as claimed in claim 6, said voltage monitoring means comprising a comparator circuit for comparing the previously set specified voltage with the output voltage of the main power supply and a circuit for outputting the signal representing the comparison result of the comparator circuit to said detection result memory means and said system control means.

10. An apparatus as claimed in claim 6, said system control means including a flag, set or reset on the basis of the information memorized by the detection result memory means and means which determines the status of the flag, wherein the determining means determines the flag after execution of the program has been started and stops the execution of the program when the flag status indicates the occurrence of the voltage drop.

* * * * *